United States Patent
Yeo

(10) Patent No.: US 7,396,416 B2
(45) Date of Patent: Jul. 8, 2008

(54) SUBSTRATE CLEANING DEVICE

(75) Inventor: In-Joon Yeo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 644 days.

(21) Appl. No.: 10/972,026

(22) Filed: Oct. 21, 2004

(65) Prior Publication Data

US 2005/0087210 A1 Apr. 28, 2005

(30) Foreign Application Priority Data

Oct. 22, 2003 (KR) ............... 10-2003-0073997

(51) Int. Cl.
*B08B 3/12* (2006.01)
*B08B 3/02* (2006.01)

(52) U.S. Cl. .......... 134/1; 134/1.3; 134/33; 134/148; 134/151; 134/176; 134/184; 134/902

(58) Field of Classification Search ........ 134/1, 134/1.3, 184, 147, 148, 151, 198, 902, 32, 134/33, 34, 176
See application file for complete search history.

(56) References Cited

U.S. PATENT DOCUMENTS

| 6,679,272 | B2 * | 1/2004 | Bran et al. ............... 134/1.3 |
| 6,684,890 | B2 * | 2/2004 | Nicolosi et al. ........... 134/148 |
| 7,017,597 | B2 * | 3/2006 | Yoon et al. ............... 134/184 |
| 7,047,989 | B2 * | 5/2006 | Nicolosi et al. ........... 134/184 |
| 2003/0015216 | A1 | 1/2003 | Nicolosi et al. |
| 2003/0024547 | A1 | 2/2003 | Bran et al. |
| 2003/0178049 | A1 * | 9/2003 | Yoon et al. ............... 134/147 |

FOREIGN PATENT DOCUMENTS

JP 2001-53047 2/2001
KR 2002-0022545 3/2002

* cited by examiner

*Primary Examiner*—Michael Barr
*Assistant Examiner*—Saeed T Chaudhry
(74) *Attorney, Agent, or Firm*—Marger Johnson & McCollom, P.C.

(57) ABSTRACT

A substrate cleaning device comprises a chamber for cleaning a substrate; a substrate support installed in the chamber providing a surface for supporting the substrate during cleaning thereof; at least one cleaning solution supply outlet for spraying a cleaning solution onto a surface of the substrate; a vibration force generator for supplying a vibratory action; a vibration force generating shaft which receives said vibratory action from the vibration force generator so that said vibration force generating shaft vibrates for agitating the cleaning solution on the substrate; and a vibration force distributor for preventing a vibration force from being concentrated on a portion of the substrate below the vibration force generating shaft.

26 Claims, 5 Drawing Sheets

SUBSTRATE CLEANING DEVICE

CROSS-REFERENCE TO RELATED APPLICATION

This application claims the benefit of Korean Patent Application No. 2003-73997, filed Oct. 22, 2003, the disclosure of which is hereby incorporated herein by reference in its entirety.

BACKGROUND OF THE INVENTION

1. Field of the Invention

The present invention relates to a substrate cleaning device and, more particularly, to a substrate cleaning device which prevents a megasonic power from being locally concentrated on a substrate.

2. Description of the Related Art

In general, a semiconductor manufacturing process requires a cleaning process which cleans organics, particles, metallic ions, oxides, from the surface of a semiconductor wafer. Since such contaminants affect the quality and manufacturing yield of the semiconductors, contamination management is very strictly controlled.

The cleaning process is performed frequently during about 40% of the entire semiconductor manufacturing process. It is an essential part of the semiconductor manufacturing process to maintain an ultra-clean wafer since this is required in an ultra large scale integration (ULSI) technique.

As for this cleaning process, a mechanical method, a chemical method, or an ultrasonic method have traditionally been used. Now, as a further technique used to remove contaminants having a size less than micron is a megasonic method. This latter method uses a megasonic process that employs high frequency sound wave. This has attracted substantial public attention due to its high cleaning efficiency and safety.

In the case of a wet batch method, a cassette having wafers is immersed in a bath filled with a cleaning compound, and a megasonic sound wave having a high frequency (about 1 MHz) is generated. In this way, megasonic energy is transferred to the surface of the wafer in parallel through the cleaning compound.

However, the wet batch method has a problem in that a substantial amount of time is required. This is because the cassette is immersed into several bathes in sequence which are in turn used for wafer cleaning. This leads to a very large-sized cleaning device.

A single wafer spin method can be employed instead of the wet batch method. As one example, the single wafer spin method is disclosed in U.S. Patent Publication No. 20030015216("US '216"). According to US '216, a megasonic probe with a probe shaft extends generally parallel to a surface of a rotating substrate. At least one dispenser applies a cleaning liquid onto the surface of the substrate. The megasonic probe agitates the liquid on the surface.

However, there is a problem with the process of US '216 in that the megasonic probe cannot be used when a pattern size is less than 90 nm because pattern damage occurs due to the megasonic wave. As shown in, FIG. 1 of US '216, a cleaning solution 5 is supplied onto the surface of a substrate 1 by a cleaning solution supplying nozzle (not shown), and a megasonic probe shaft 3 vibrates to agitate the cleaning solution 5 on the substrate 1, thereby performing a cleaning process. Here, a megasonic wave is locally concentrated on a portion A of the substrate 1 below the megasonic probe shaft 3 as compared to the adjacent portions of the substrate 1. This leads to damage of the substrate 1.

SUMMARY OF THE INVENTION

In one embodiment, a semiconductor cleaning device comprises a chamber for cleaning a substrate; a substrate support installed in the chamber providing a surface for supporting the substrate during cleaning thereof; at least one cleaning solution supply outlet for spraying a cleaning solution onto a surface of the substrate; a vibration force generator for supplying a vibratory action; a vibration force generating shaft which receives said vibratory action from the vibration force generator so that said vibration force generating shaft vibrates for agitating the cleaning solution on the substrate; and a vibration force distributor for preventing a vibration force from being concentrated on a portion of the substrate below the vibration force generating shaft.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE PREFERRED EMBODIMENTS

Figure 1:
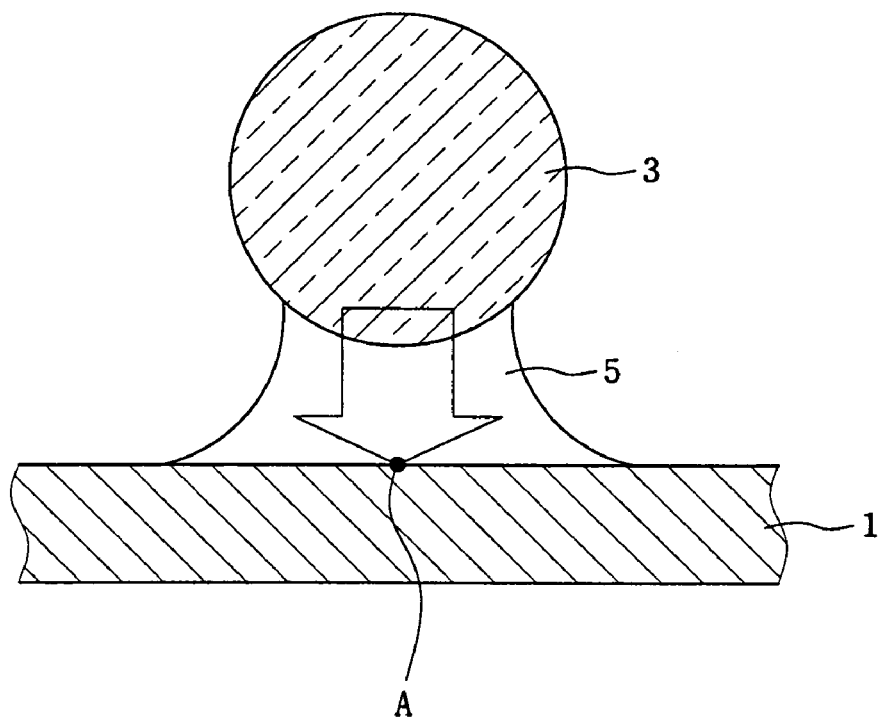
FIG. 1 is a schematic view illustrating a vibration force of a megasoic probe shaft transferred to a substrate according to a conventional technique.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2:
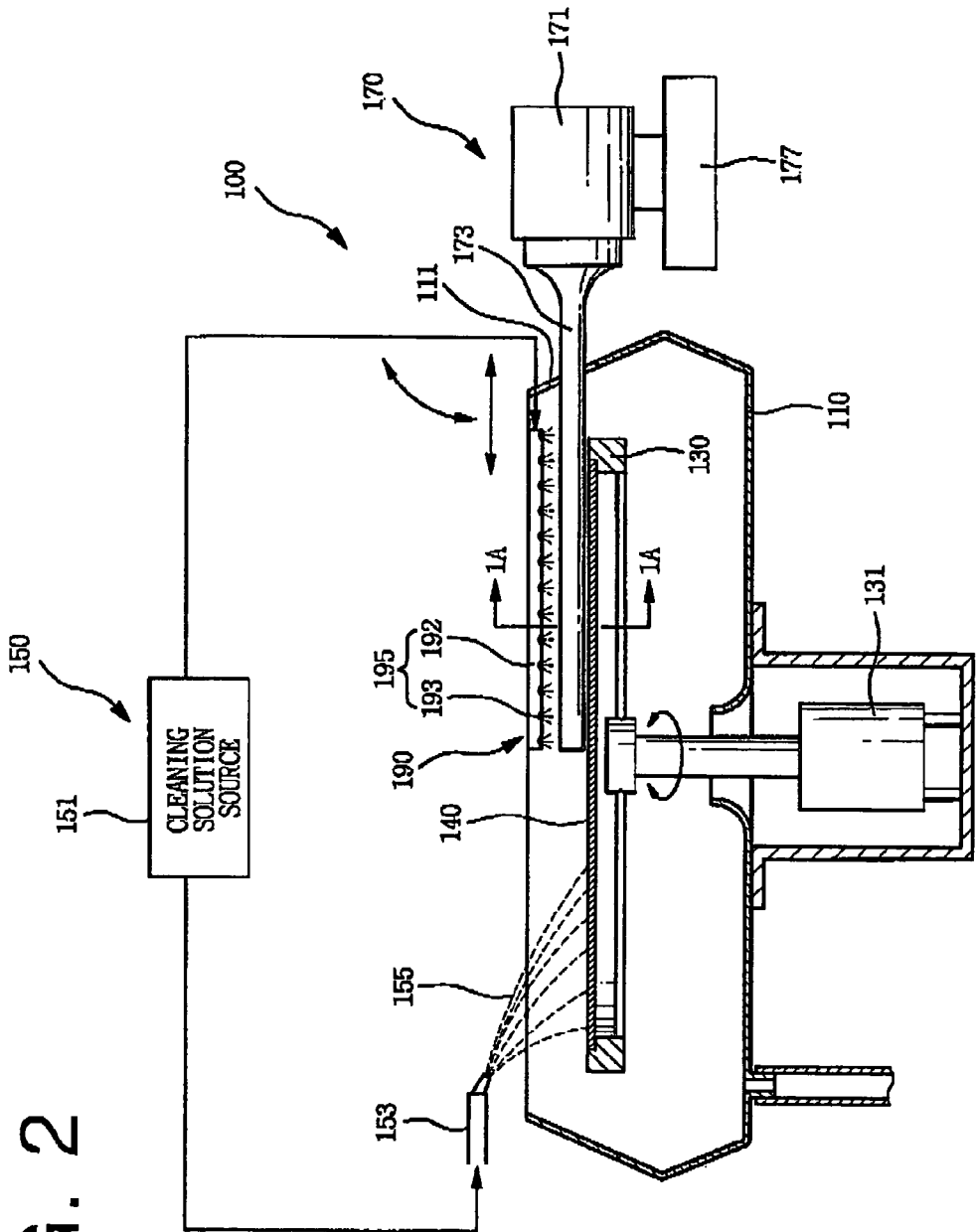
FIG. 2 is a schematic view illustrating a substrate cleaning device according to a first embodiment of the present invention.

As shown in FIG. 2, a substrate cleaning device 100 includes a chamber 110, a substrate support 130, a cleaning solution supply portion 150, a megasonic generating portion 170, and a vibration force distributing portion 190.

The chamber 110 provides a space for substrate cleaning and has a tank form whose top portion is opened.

The substrate support 130 is arranged to be rotated by a rotational driver apparatus 131, and a substrate 140 is rested on a top portion of the substrate support 130.

The cleaning solution supply portion 150 supplies a predetermined amount of cleaning solution onto a surface of the substrate 140. Supply portion 150 includes a cleaning solution source 151 and a cleaning solution supply nozzle 153 which sprays the cleaning solution supplied from the cleaning solution source 151 onto the surface of the substrate 140. As the cleaning solution, a chemical such as ammonia, nitric acid, and sulfuric acid, or mineral water is used.

The megasonic generating portion 170 includes a vibration force generator 171 which generates a vibration force of a high frequency, and a vibration force generating shaft 173 which is coupled to the vibration force generator 171 which vibrates with high frequency. The vibration force generating shaft 173 is arranged at a location adjacent to the surface of, and parallel to, the substrate 140. The vibration force generating shaft 173 agitates the cleaning solution 155 on the surface of the substrate 140 to collect stray particles on the substrate 140, whereby contaminants are vibrated and removed from the substrate 140.

Here, the vibration force generating shaft 173 performs a straight line motion (along a direction "↔"), or a rotational motion (along a direction "↻"), with respect to the substrate. For facilitating these vibratory motions, a slot 111 is formed on one side of the chamber 110.

The vibration force distributing portion 190 prevents a vibration force from being concentrated on a portion of the substrate below the vibration force generating shaft 173. The vibration force is distributed by a water film generator 195 which forms a water film 191 on a surface of the vibration force generating shaft 173.

Figure 4:
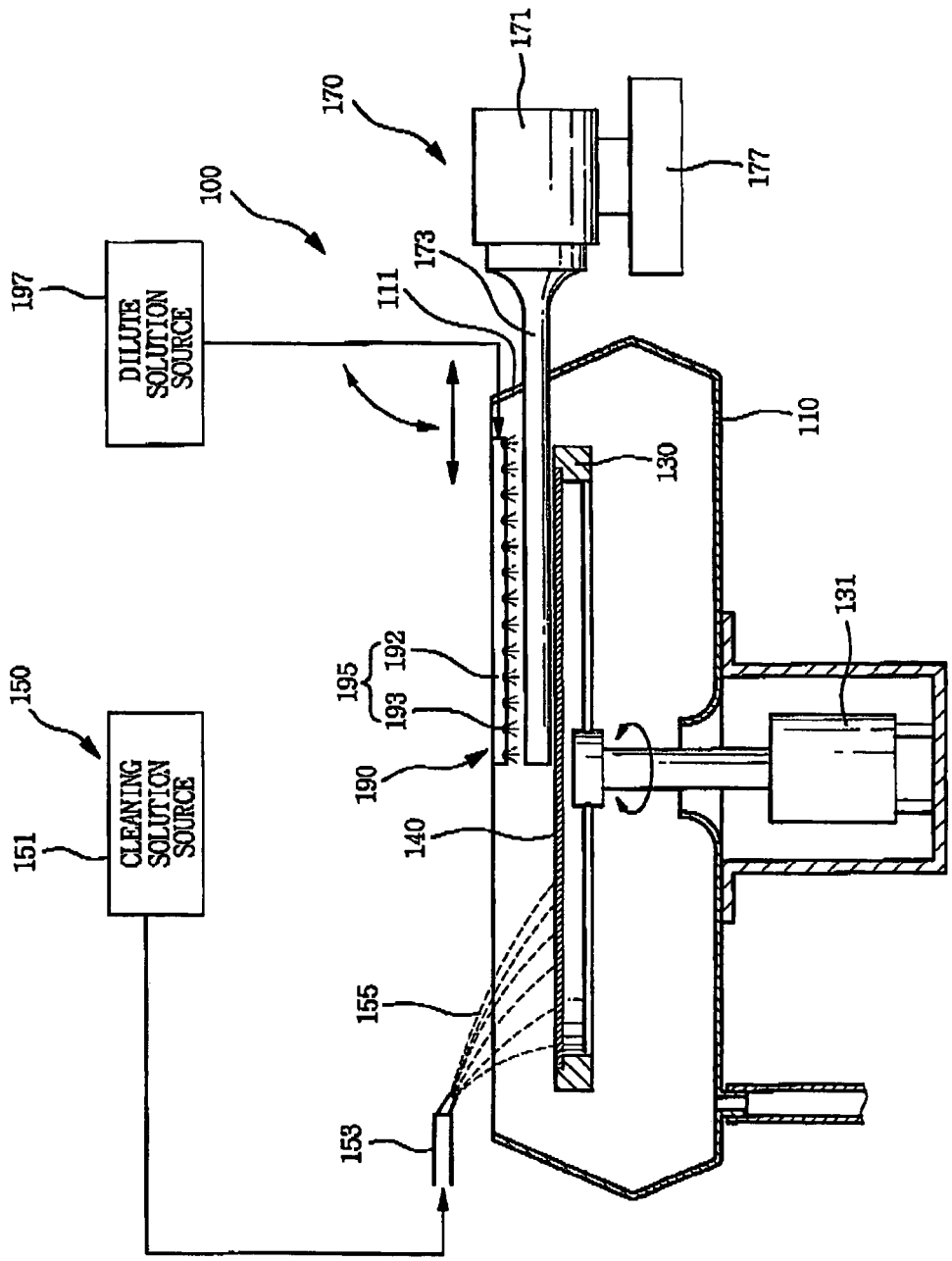
FIG. 4 is a schematic view illustrating a substrate cleaning device according to a second embodiment of the present invention.
Figure 5:
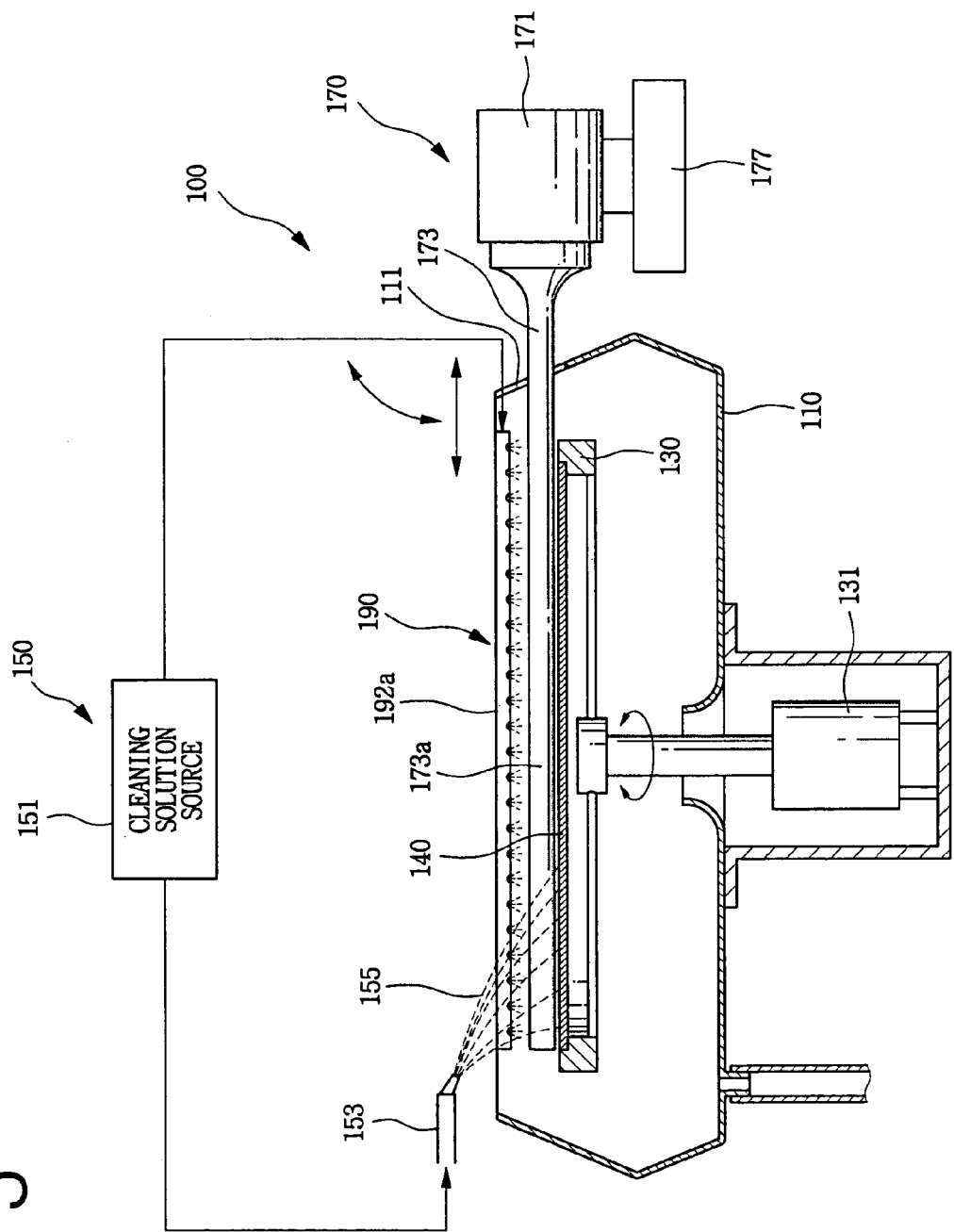
FIG. 5 is a schematic view illustrating a substrate cleaning device according to a third embodiment of the present invention.

The water film generator 195 has a structure which sprays a predetermined liquid on the whole surface of the vibration force generating shaft 173, and preferably employs a liquid spray nozzle installed above the vibration force generating shaft 173 in a longitudinal direction. In more detail, a supply tube 192 is installed above the vibration force generating shaft 173 in a direction substantially parallel to the vibration force generating shaft 173. A plurality of spray holes 193 are formed in a lower portion of the supply tube 192 spaced apart from each other. Here, a liquid supplied through the supply tube 192 is a cleaning solution supplied from the cleaning solution source 151 as shown in FIG. 2 or a dilute solution supplied from a dilute solution source 197 as shown in FIG. 4. The dilute solution is formed by diluting the cleaning solution supplied from the cleaning solution supply nozzle, and is preferably using deionized (DI) water. The liquid sprayed to the vibration force generating shaft 173 is under enough of a pressure to form a water film 191 on a surface of the vibration force generating shaft 173. Thus, this liquid preferably has a pressure lower than a pressure of a cleaning solution supplied from the cleaning solution supply nozzle 153. In FIG. 5, a length of a vibration force generating shaft 173 is longer than those of FIGS. 2 and 4. Unlike the vibration force generating shaft 173 having a half the length as the length of the substrate 140, a vibration force generating shaft 173a has substantially the same length as the substrate 140. Thus, the substrate cleaning area per hour is increased thereby reducing the actual cleaning time. Here, a supply tube 192a of the vibration force distribution portion 190 is also longer.

A substrate cleaning process and operation for distributing a vibration force to prevent a vibration force from being locally transferred to a portion of the substrate 140 are explained below.

Figure 3:
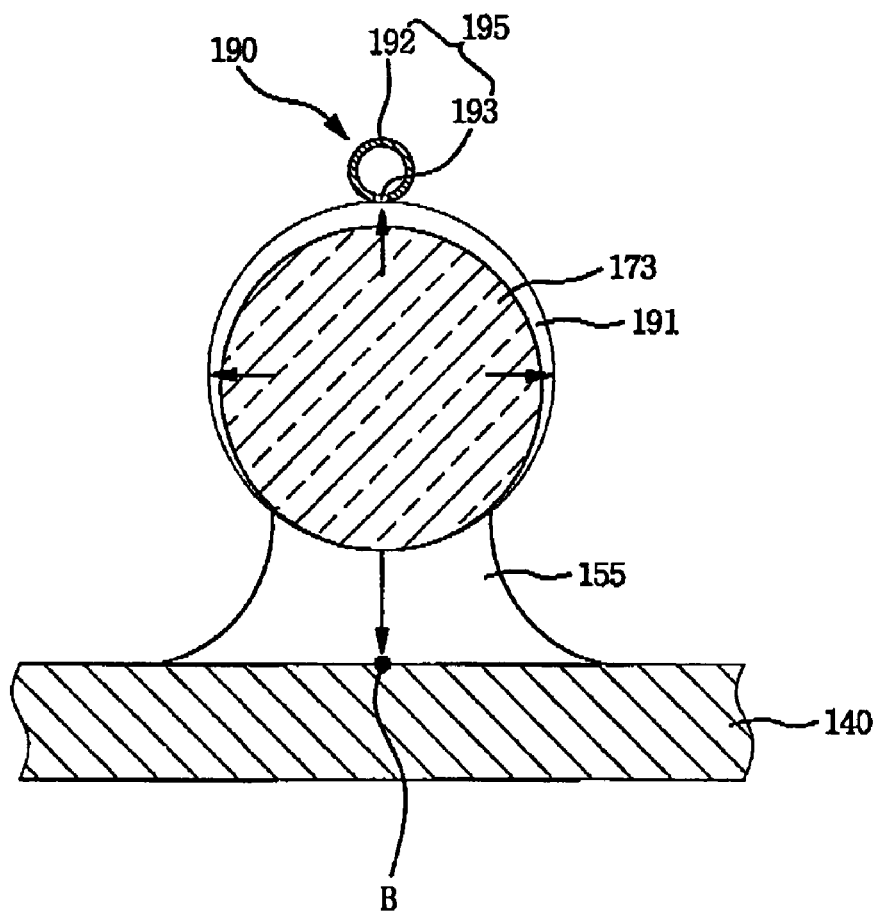
FIG. 3 is a cross-sectional view taken along line 1A-1A' of FIG. 2.

First, a substrate 140 is located on a top surface of the substrate support 130, and the vibration force generating portion 170 is moved by a moving unit 177 such that the vibration force generating shaft 173 is located spaced apart from and parallel to a surface of the substrate 140. The substrate support 130 is rotated by the driver 131, and a cleaning solution supplied through the cleaning solution supply nozzle 153 from the cleaning solution source 151 is sprayed at a predetermined pressure. At the same time, the vibration force generator 171 is driven to generate a high frequency vibration force so that the vibration force generating shaft 173 vibrates at such a high frequency. Therefore, the vibration force of the vibration force generating shaft 173, as shown in FIG. 3, agitates the cleaning solution 155 supplied to the surface of the substrate 140, thereby removing particles on the substrate 140. In this case, a predetermined amount of liquid is supplied through the liquid spray holes 193 of the supply tube 192 above the vibration force generating shaft 173 so that a water film 191 is formed on the surface of the vibration force generating shaft 173. A vibration force of the vibration force generating shaft 173 is dispersed to all directions by the water film 191. Therefore, the intensity of a vibration force transferred downwardly from the vibration force generating shaft 173 is relatively mitigated, and so a strong vibration force is applied to a portion B (see FIG. 3) of the substrate 140, thereby preventing a pattern damage.

Hereinbefore, the substrate cleaning device of the present invention forms a water film on a surface of the vibration force generating shaft to distribute a vibration forces to prevent a vibration force from being concentrated on a portion of the substrate, thereby preventing a pattern damage.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A substrate cleaning device, comprising:
a chamber for cleaning a substrate;
a substrate support installed in the chamber providing a surface for supporting the substrate during cleaning thereof;
at least one cleaning solution supply outlet for spraying a cleaning solution onto a surface of the substrate;
a vibration force generator for supplying a vibratory action;
a vibration force generating shaft which receives said vibratory action from the vibration force generator so that said vibration force generating shaft vibrates for agitating the cleaning solution on the substrate; and
a vibration force distributor forming a liquid film on a surface of the vibration force generating shaft for preventing a vibration force from being concentrated on a portion of the substrate below the vibration force generating shaft, wherein the vibration force distributor is installed above the vibration force generating shaft to spray the liquid onto the vibration force generating shaft.

2. The device of claim 1, wherein the vibration force distributor sprays said liquid onto substantially the entire surface of the vibration force generating shaft located within the confines of said chamber.

3. The device of claim 1, wherein the vibration force distributor includes a supply tube having a plurality of liquid spray apertures formed in a lower portion of the supply tube.

4. The device of claim 1, wherein a liquid supplied to the vibration force distributor is at a pressure high enough to form said liquid film on a surface of the vibration force generating shaft.

5. The device of claim 1, wherein the vibration force generating shaft vibrates in a straight line motion or in a rotational motion with respect to the substrate.

6. The device of claim 1, wherein the liquid film comprises a cleaning solution supplied to the vibration force distributor.

7. The device of claim 1, wherein the liquid film comprises a dilute cleaning solution.

8. The device of claim 7, wherein the dilute solution an aqueous dilute solution.

9. The device of claim 1, wherein the substrate support is rotatable in a predetermined direction by a rotational driver apparatus.

10. A method for cleaning a substrate, comprising:
introducing said substrate into a chamber for cleaning said substrate;
spraying a cleaning solution onto a surface of the substrate;
providing a vibration force generating shaft;
spraying a liquid onto a surface of the vibration force generating shaft for preventing the concentration of said vibration force thereon;
vibrating said vibration force generating shaft for agitating the cleaning solution on the substrate; and
preventing a vibration force from being concentrated on a portion of the substrate below the vibration force generating shaft.

11. The method of claim 10, which further includes the step of spraying said liquid onto substantially the entire surface of the vibration force generating shaft located within the confines of said chamber.

12. The method of claim 10, wherein the liquid is sprayed from above the vibration force generating shall.

13. The method of claim 10, wherein the liquid is sprayed from a supply tube having a plurality of liquid spray apertures formed in a lower portion of the supply tube.

14. The method of claim 10, wherein the step of spraying a liquid comprises spraying a liquid film.

15. The method of claim 10, wherein the vibration force generating shaft vibrates in a straight line motion or in a rotational motion with respect to the substrate.

16. The method of claim 10, wherein the spray comprises a cleaning solution.

17. The method of claim 10, which further includes providing a vibration force distributor, and forming a liquid film on a surface of the vibration force generating shaft with said vibration force distributor.

18. The method of claim 17, wherein the vibration force distributor sprays said liquid onto substantially the entire surface of the vibration force generating shaft.

19. The method of claim 18, wherein the vibration force distributor is installed above the vibration force generating shaft to spray the liquid onto the vibration force generating shaft.

20. The method of claim 19, wherein the vibration force distributor includes a supply tube having a plurality of liquid spray apertures formed in a lower portion of the supply tube.

21. The method of claim 17, wherein a liquid supplied to the vibration force distributor is at a pressure high enough to form said liquid film on a surface of the vibration force generating shaft.

22. The method of claim 17, wherein the liquid film comprises a cleaning solution supplied to the vibration force distributor.

23. The method of claim 17, wherein the liquid film comprises a dilute cleaning solution.

24. The method of claim 23, wherein the dilute solution an aqueous dilute solution.

25. The method of claim 10, wherein the vibration force generating shaft vibrates in a straight line motion or in a rotational motion with respect to the substrate.

26. The method of claim 10, wherein the vibration force generating shaft extends to a point above between the midpoint of the substrate and an edge opposite the midpoint of the substrate.

* * * * *

UNITED STATES PATENT AND TRADEMARK OFFICE
CERTIFICATE OF CORRECTION

| | | |
|---|---|---|
| PATENT NO. | : 7,396,416 B2 | Page 1 of 1 |
| APPLICATION NO. | : 10/972026 | |
| DATED | : July 8, 2008 | |
| INVENTOR(S) | : In-Joon Yeo | |

It is certified that error appears in the above-identified patent and that said Letters Patent is hereby corrected as shown below:

Column 5, line 27, the word "shall" should read -- shaft --.

Signed and Sealed this

Twenty-third Day of December, 2008

JON W. DUDAS
*Director of the United States Patent and Trademark Office*